(12) United States Patent
Wang

(10) Patent No.: US 10,503,189 B1
(45) Date of Patent: Dec. 10, 2019

(54) VOLTAGE REGULATOR AND DYNAMIC BLEEDER CURRENT CIRCUIT

(71) Applicant: Winbond Electronics Corp., Taichung (TW)

(72) Inventor: Jing-Chyi Wang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/391,957

(22) Filed: Apr. 23, 2019

(30) Foreign Application Priority Data

Aug. 8, 2018 (TW) .............................. 107127531 A

(51) Int. Cl.
*G05F 1/59* (2006.01)
*H03K 5/24* (2006.01)
*H03F 3/45* (2006.01)
*G05F 3/26* (2006.01)

(52) U.S. Cl.
CPC ................ *G05F 1/59* (2013.01); *G05F 3/262* (2013.01); *H03F 3/45179* (2013.01); *H03K 5/2472* (2013.01)

(58) Field of Classification Search
CPC ........ G05F 1/59; G05F 3/262; H03F 3/45179; H03K 5/2472
See application file for complete search history.

(56) References Cited

U.S. PATENT DOCUMENTS

| | | | | |
|---|---|---|---|---|
| 3,383,579 A | * | 5/1968 | Hung | G05F 1/45 363/54 |
| 5,814,980 A | * | 9/1998 | Lewis | G05F 3/247 323/282 |
| 8,773,105 B1 | * | 7/2014 | Kang | H02H 9/04 323/313 |
| 8,937,433 B1 | * | 1/2015 | Wang | H05B 33/0824 315/122 |
| 9,510,415 B1 | * | 11/2016 | Wang | H05B 33/083 |
| 9,661,696 B1 | * | 5/2017 | Chen | H05B 33/083 |
| 9,917,513 B1 | * | 3/2018 | Le | H02M 3/156 |

(Continued)

FOREIGN PATENT DOCUMENTS

CN 1902558 A 1/2007

*Primary Examiner* — Adolf D Berhane
(74) *Attorney, Agent, or Firm* — Muncy, Geissler, Olds & Lowe, P.C.

(57) ABSTRACT

A dynamic bleeder-current circuit for use in a voltage regulator is provided. The dynamic bleeder-current circuit includes a first bleeder-current circuit and a second bleeder-current circuit. The first bleeder-current circuit includes an input stage, a current comparator, and a bleeder-current output stage. The input stage maps a bias current in an operational amplifier in the voltage regulator with a predetermined ratio to generate a mapped current. The current comparator compares a pull current and a sink current generated by the mapped current. The bleeder-current output stage determines whether to use a first current to discharge the load capacitor of the voltage regulator according to a comparison result from the current comparator. The second bleeder-current circuit is configured to provide a second bleeder current to discharge the load capacitor. The first current is greater than the second current, and the pull current is equal to the second current.

10 Claims, 5 Drawing Sheets

(56) References Cited

U.S. PATENT DOCUMENTS

| | | | |
|---|---|---|---|
| 2014/0210266 A1* | 7/2014 | Tournatory | H02M 3/158 307/31 |
| 2014/0266088 A1* | 9/2014 | Makino | G05F 1/563 323/266 |
| 2016/0124455 A1* | 5/2016 | Sambucco | G05F 3/267 323/315 |

* cited by examiner

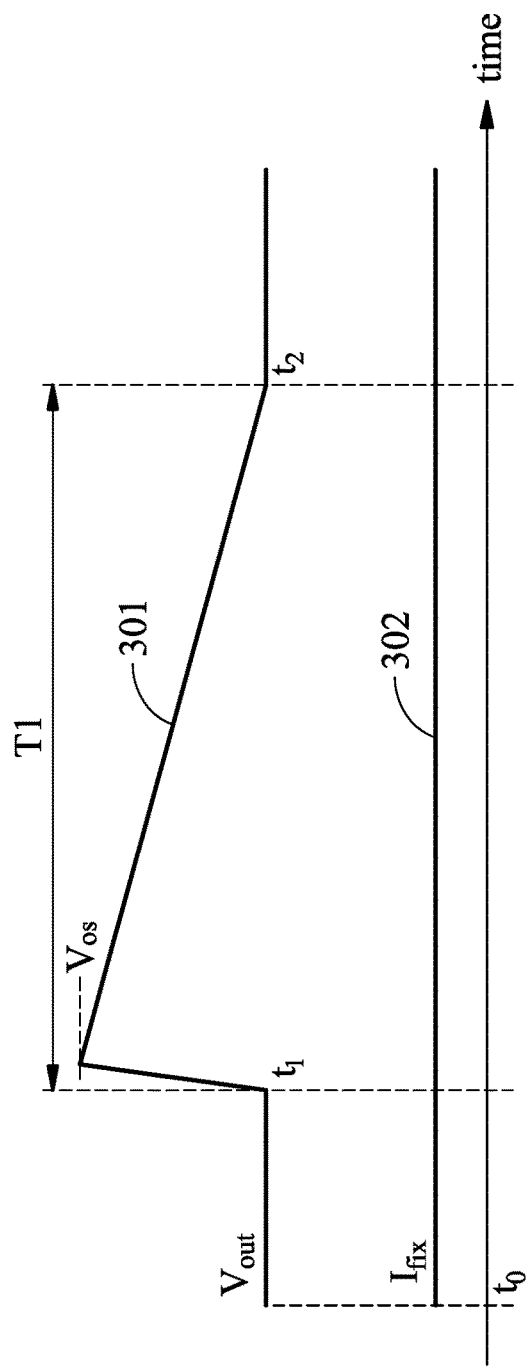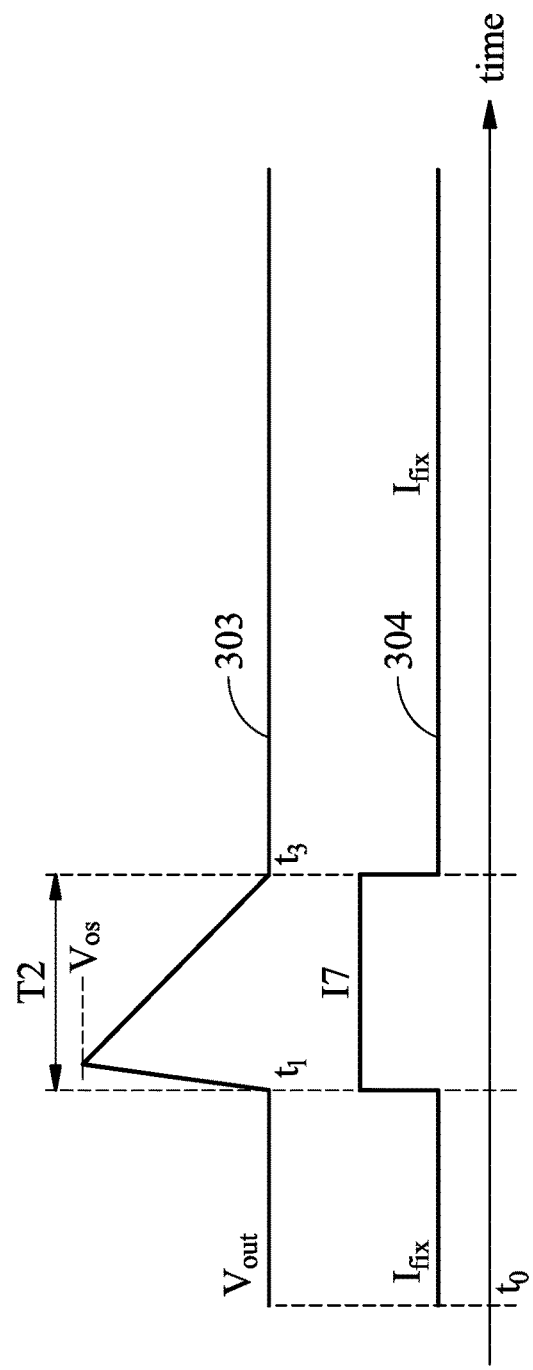

VOLTAGE REGULATOR AND DYNAMIC BLEEDER CURRENT CIRCUIT

CROSS REFERENCE TO RELATED APPLICATIONS

This Application claims priority of Taiwan Patent Application No. 107127531, filed on Aug. 8, 2018, the entirety of which is incorporated by reference herein.

BACKGROUND OF THE INVENTION

Field of the Invention

The present invention relates to electronic circuits, and, in particular, to a voltage regulator and a dynamic bleeder current circuit.

Description of the Related Art

With the decreasing scale of semiconductor manufacturing processes, power MOS channel lengths have become shorter, resulting in higher junction temperatures. As a result, the leakage current of the power MOSFET has increased correspondingly. In addition, the output voltage of a voltage regulator may experience voltage overshoot in response to the backend components being activated or deactivated.

Accordingly, there is demand for a voltage regulator and a dynamic bleeder current circuit to solve the aforementioned problems.

BRIEF SUMMARY OF THE INVENTION

A detailed description is given in the following embodiments with reference to the accompanying drawings.

In an exemplary embodiment, a dynamic bleeder-current circuit for use in a voltage regulator is provided. The dynamic bleeder-current circuit includes: a first bleeder-current circuit and a second bleeder-current circuit. The first bleeder-current circuit includes an input stage, a current comparator, and a bleeder-current output stage. The input stage maps a bias current in an operational amplifier in the voltage regulator with a predetermined ratio to generate a mapped current. The current comparator compares a pull current to a sink current, wherein the sink current is generated by the mapped current. The bleeder-current output stage determines whether to use a first current to discharge a load capacitor of the voltage regulator according to the comparison result from the current comparator. The second bleeder-current circuit is configured to provide a second bleeder current to discharge the load capacitor of the voltage regulator. The first current is greater than the second current, and the pull current is equal to the second current.

In another exemplary embodiment, a voltage regulator is provided. The voltage regulator includes an operational amplifier, an N-type power MOSFET, and a dynamic bleeder-current circuit. The operation amplifier has a positive input terminal, a negative input terminal, and an output terminal that are respectively electrically connected to a reference voltage of the voltage regulator, an output terminal of the voltage regulator, and a first node. The output terminal of the voltage regulator has a load capacitor. The N-type power MOSFET has a gate, drain, and source respectively electrically connected to the first node, a voltage source, and the output terminal of the voltage regulator. The dynamic bleeder-current circuit includes a first bleeder-current circuit and a second bleeder-current circuit. The first bleeder-current circuit includes an input stage, a current comparator, and a bleeder-current output stage. The input stage maps a bias current in an operational amplifier in the voltage regulator with a predetermined ratio to generate a mapped current. The current comparator compares a pull current and a sink current, wherein the sink current is generated by the mapped current. The bleeder-current output stage determines whether to use a first current to discharge a load capacitor of the voltage regulator according to a comparison result from the current comparator. The second bleeder-current circuit is configured to provide a second bleeder current to discharge the load capacitor of the voltage regulator. The first current is greater than the second current, and the pull current is equal to the second current.

BRIEF DESCRIPTION OF THE DRAWINGS

The present invention can be more fully understood by reading the subsequent detailed description and examples with references made to the accompanying drawings, wherein:

FIG. 3A is a diagram of an operation curve between the voltage and current of the voltage regulator in accordance with the embodiment of FIG. 1;

FIG. 3B is a diagram of an operation curve between the voltage and current of the voltage regulator in accordance with the embodiment of FIG. 2B.

DETAILED DESCRIPTION OF THE INVENTION

Figure 1:
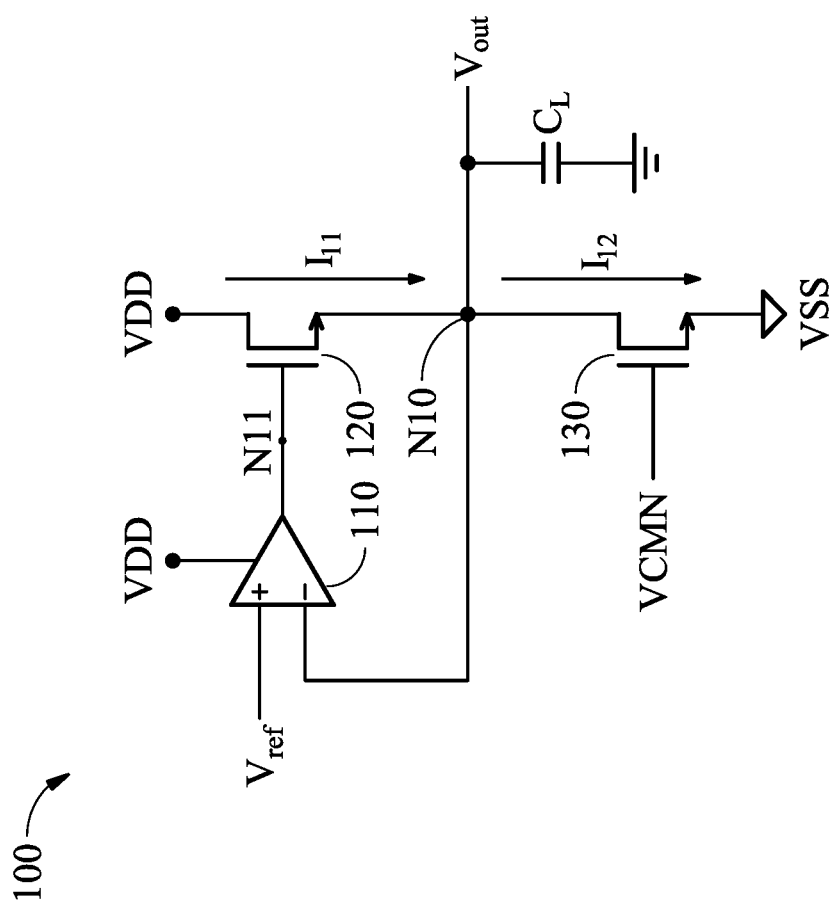
FIG. 1 is a diagram of a voltage regulator in accordance with an embodiment of the invention.

FIG. 1 is a diagram of a voltage regulator in accordance with an embodiment of the invention.

As depicted in FIG. 1, the voltage regulator 100 includes an operational amplifier (OPAmp) 110, a power MOSFET 120, and a transistor 130. The positive input terminal of the operational amplifier 110 receives a reference voltage $V_{ref}$, and the negative input terminal of the operational amplifier 110 is electrically connected to an output terminal (e.g., node N10) of the voltage regulator 100, and the output voltage $V_{out}$ at node N10 is retained at the reference voltage $V_{ref}$.

The power MOSFET 120 provides a load current I1 to the backend electronic components. However, in practical conditions, the load current provided by the power MOSFET 120 may be changed by activating or deactivating the backend electronic components. Meanwhile, voltage overshoot may occur at the output terminal of the voltage regulator 100, such that the output voltage $V_{out}$ cannot be retained at the reference voltage $V_{ref}$. The condition of voltage overshoot may be induced for the following reasons: (1) the power MOSFET 120 has its own leakage current; or (2) the response speed of the operational amplifier 110 is too slow.

For example, theoretically, when the backend electronic components of the voltage regulator 100 is deactivated, the load current I11 provided by the power MOSFET 120 may decrease accordingly. However, since a response time is required to respond the voltage change of the negative input terminal of the operational amplifier 110 to the output terminal (e.g., node N11) of the operational amplifier 110, the power MOSFET 120 cannot be shut down in time. As a result, the power MOSFET 120 may provide a larger load current I11 for a time period, and the decoupling capacitor of the backend electronic components of the voltage regulator 100 may store a certain level of electricity, resulting in voltage overshoot of the output voltage $V_{out}$ of node N10. The capacitance value C of the decoupling capacitor is generally expressed in nanofarads (nFs), and the store electricity Q can be calculated using the following equation: Q=C*V, wherein V is the voltage $V_{out}$ at node N10.

The transistor 130 is used as a bleeder-current circuit that provides a fixed bleeder current I12. In order to avoid high power consumption of the voltage regulator 100, the fixed bleeder current I12 is not large, such as a 1 μA. According to the equation of Q=I*t, it may take a very long time to fully discharge the electric charges stored in the decoupling capacitor due to voltage overshoot. If the transistor 130 may provide a larger fixed bleeder current I12, although the discharge time can be reduced, it may also cause a big load current for the power source voltage VDD, that does not comply with the design rules of a low-power circuit.

Figure 2A:
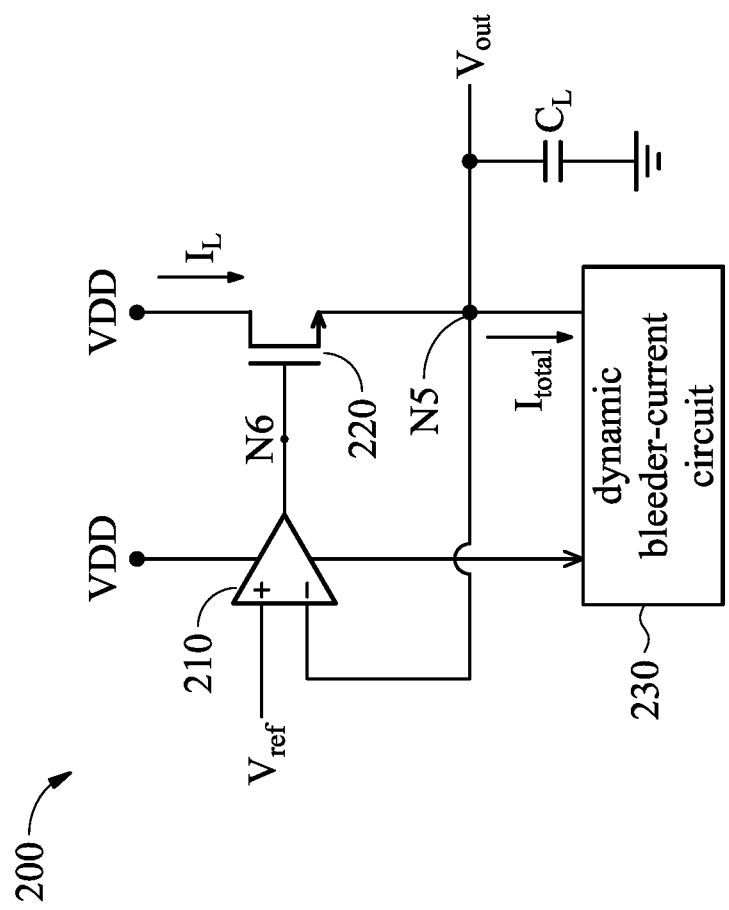
FIG. 2A is a diagram of a voltage regulator in accordance with another embodiment of the invention.

FIG. 2A is a diagram of a voltage regulator in accordance with another embodiment of the invention.

As depicted in FIG. 2A, the voltage regulator 200 includes an operational amplifier 210, a power MOSFET 220, and a dynamic bleeder-current circuit 230. The positive input terminal of the operational amplifier 210 receives a reference voltage $V_{ref}$, and the negative input terminal of the operational amplifier 210 is connected to the output terminal (e.g., node N5) of the voltage regulator 200, and the output voltage $V_{out}$ at node N5 is retained at the reference voltage $V_{ref}$.

The power MOSFET 220 provides a load current IL to the backend electric components of the voltage regulator 200. Similar to the voltage regulator 100 in FIG. 1, when the backend electric component of the voltage regulator 200 is deactivated, the output terminal (e.g., node N6) of the voltage regulator 200 may also have voltage overshoot due to the leakage current of the power MOSFET 220 and the slow response speed of the operational amplifier 210.

Figure 2B:
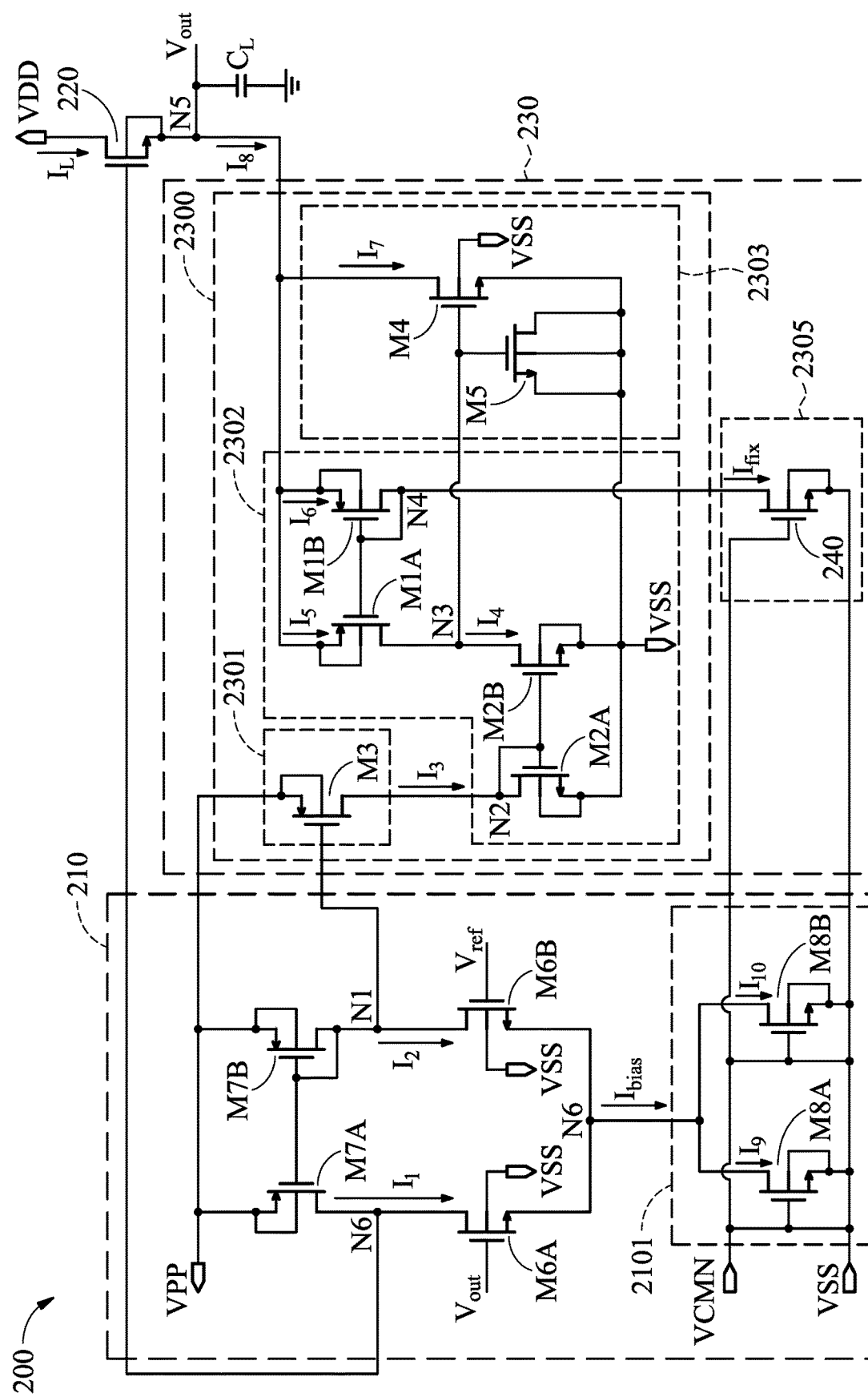
FIG. 2B is a schematic diagram of the voltage regulator in accordance with the embodiment of FIG. 2A.

The dynamic bleeder-current circuit 230 of the present invention may determine whether the output terminal of the voltage regulator 200 has voltage overshoot. If it is determined that there is voltage overshoot at the output terminal of the voltage regulator 200, the dynamic bleeder-current circuit 230 may activate the first bleeder-current circuit 2300 (as shown in FIG. 2B) thereof to discharge the decoupling capacitor with a large bleeder current, so that the amount of time during which the output terminal of the voltage regulator 200 has voltage overshoot can be significantly reduced. If it is determined that there is no voltage overshoot at the output terminal of the voltage regulator 200, the dynamic bleeder-current circuit 230 may use its second bleeder-current circuit 2305 (as shown in FIG. 2B) to discharge the decoupling capacitor with a fixed bleeder current. The current $I_{total}$ indicates the total current provided by the dynamic bleeder-current circuit 230 to discharge the decoupling capacitor.

FIG. 2B is a schematic diagram of the voltage regulator in accordance with the embodiment of FIG. 2A.

As depicted in FIG. 2B, the operational amplifier 210 includes MOSFETs M6A-M6B, M7A-M7B, and M8A-M8B.

For example, the operational amplifier 210 is formed by the MOSFETs M6A-M6B and M7A-M7B, wherein the gate of the MOSFET M6A, for example, is the negative input terminal of the operational amplifier 210, that is connected to the output terminal (e.g., node N5) of the voltage regulator 200 having the output voltage $V_{out}$. The gate of the MOSFET M6B is the positive input terminal of the operational amplifier 210, that is electrically connected to the reference voltage $V_{ref}$. The MOSFETs M8A-M8B may form a current source, such as providing a bias current $I_{bias}$ for the operational amplifier 210. For example, the bias current $I_{bias}$ may be equal to 1 μA, but the invention is not limited thereto. If the MOSFETs M8A and M8B are matching each other (e.g., having the same W/L ratio), the current I9 flowing through the MOSFET M8A and the current I10 flowing through the MOSFET M8B are equal to 0.5 Ibias. The MOSFETs M7A and M7B forms a current mirror, and the MOSFETs M7A and M7B are matching P-type MOSFETs (e.g., having the same W/L ratio).

The dynamic bleeder-current circuit 230 includes a first bleeder-current circuit 2300 and a second bleeder-current circuit 2305. The first bleeder-current circuit 2300 is configured to provide a large current (e.g., current I7 flowing through the MOSFET M4) to discharge the decoupling capacitor when there is voltage overshoot of the output voltage Vout at the output terminal of the voltage regulator 200. The second bleeder-current circuit 2305 includes a MOSFET 240 that provides a fixed bleeder current $I_{fix}$ to discharge the decoupling capacitor. The gate, drain, and source of the MOSFET 240 are electrically connected to a control voltage VCMD, node N4, and the ground voltage source VSS. In an embodiment, the fixed bleeder current $I_{fix}$ is equal to the leakage current of the power MOSFET 220, and the fixed bleeder current $I_{fix}$ may be equal to 0.5 μA, but the invention is not limited thereto. It should be noted that when the first bleeder-current circuit 2300 is not activated to provide the large bleeder current (e.g., current I7), the second bleeder-current circuit 2305 still provides the fixed bleeder current $I_{fix}$.

The first bleeder-current circuit 2300 includes an input stage 2301, a current comparator 2302, and a bleeder-current output stage 2303. For example, the input stage 2301 includes a P-type MOSFET M3, wherein the gate, source, and drain of the MOSFET M3 are electrically connected to node N1, voltage VDD, and node N2 of the operational amplifier 210. In an embodiment, the W/L ratio of the MOSFET M3 is a predetermined ratio (e.g., 1/2) of that of the MOSFETs M7A and M7B. Since the MOSFET M3, M7A, and M7B also forms a current mirror, the current I3 flowing through the MOSFET M3 is half the current I2 flowing through the MOSFETs M7B and M6B. That is, the MOSFET M3 in the input stage 2301 maps the bias current in the operational amplifier 210 with a predetermined ratio, and thus the current I3 can be regarded as a mapped current.

The current comparator 2302 includes MOSFETs M1A-M1B and M2A-M2B, wherein MOSFETs M1A and M1B form a current mirror, and MOSFETs M2A and M2B form another current mirror, and these two current mirrors form the current comparator 2302. For example, the current mirror formed by the MOSFET M1A and M1B is connected to node N5 and the MOSFET 240, and the MOSFET 240 provides the fixed bleeder current $I_{fix}$. Accordingly, the currents I5 and I6 respectively flowing through the MOSFETs M1A and M1B are equal to 0.5 $I_{fix}$. In an embodiment, the fixed bleeder current $I_{fix}$ is equal to 0.5 μA, but the invention is not limited thereto.

The W/L ratio of the MOSFET M2B is a predetermined times (e.g., 3 times) of that of the MOSFET M2A, but the invention is not limited thereto. In the current mirror formed by the MOSFETs M2A and M2B, the current flowing through the MOSFET M2A is equal to the current I3 flowing through the MOSFET M3. Accordingly, the current I4 flowing through the MOSFET M2B is 3 times the current I3.

The bleeder-current output stage 2303 includes MOSFETs M4 and M5, wherein the MOSFET M4 is a bleeder-current MOSFET, and activation of the MOSFET M4 is based on its gate voltage such as the voltage VN3 at node N3 that can be regarded as a bleeder-current control voltage. When the MOSFET M4 is activated, the MOSFET M4 may provide a large bleeder current (e.g., current I7 such as 1 mA) to discharge the electric charges stored in the load capacitor CL. The MOSFET M5 is for used as a capacitor capable of lowering the variations of the voltage VN3 at node N3. In an embodiment, the MOSFET M5 can be omitted in the bleeder-current output stage 2303.

In an embodiment, in the current comparator 2302, the current I5 flowing through the MOSFET M1A can be regarded as a pull current $I_{pull}$, and the current I4 flowing through the MOSFET M2B can be regarded as a sink current $I_{sink}$. With regard to node N3 located at the cross point between the current mirror formed by the MOSFETs M1A and M1B and the other current mirror formed by the MOSFETs M2A and M2B, if the sink current is greater than or equal to the pull current $I_{pull}$, the voltage $V_{N3}$ at node N3 will be kept at 0V (e.g., grounded). If the sink current $I_{sink}$ is smaller than the pull current $I_{pull}$, it indicates that the net current ($I_{pull}$–$I_{sink}$) flowing into node N3 is greater than 0.

In addition, since node N3 is connected to the gates of the MOSFETs M4 and M5, it indicates that the net current cannot flow into the MOSFETs M4 and M5, and thus the net current may charge the capacitors formed by the coupling capacitors around node N3 and the MOSFET M5, resulting an increasing voltage $V_{N3}$ at node N3. Accordingly, in this situation, the MOSFET M4 will be activated due to the high voltage $V_{N3}$ at node N3, and thus the MOSFET M4 may provide a large bleeder current to discharge the load capacitor $C_L$.

For example, when the voltage $V_{out}$ is equal to the reference voltage $V_{ref}$, the current I1 flowing through the MOSFETs M7A and M6A and the current I2 flowing through the MOSFETs M7B and M6B are equal to half the bias current $I_{bias}$. That is, I1=I2=0.5 $I_{bias}$. For purposes of description, the bias current $I_{bias}$ is equal to 1 μA.

Meanwhile, the bias voltage $V_{bias}$ at node N1 is in a low logic state, and the MOSFETs M7A, M7B, and M3 are activated. Since the MOSFETs M3, M7A, and M7B form a current mirror, if the W/L ratio of the MOSFET M3 is half of the W/L ratio of the MOSFETs M7A and M7B, the current I3 flowing through the MOSFET M3 is half the current I2 flowing through the MOSFETs M7B and M6B. That is, I3=0.25 μA.

In the current mirror formed by the MOSFETs M2A and M2B, the current flowing through the MOSFET M2A is I3. Since the W/L ratio of the MOSFET M2B is 3 times the W/L ratio of the MOSFET M2A, the current I4 flowing through the MOSFET M2B is equal to 0.75 μA. In addition, since the MOSFET 240 provides the fixed bleeder current $I_{fix}$=0.5 μA, and the voltage VGS1 is generated while the current $I_{fix}$ (i.e., current I6) flowing through the MOSFET M1B, and the voltage VGS1 is provided to the MOSFET M1A to generate the current I5. Meanwhile, current I5 and current I6 are equal to 0.5 μA.

With regard to node N3, there are two currents pulling each other, such as the current I5=0.5 μA and the current I4=0.75 μA. The current I5 flowing through the MOSFET M1A can be regarded as a pull current $I_{pull}$, and the current I4 flowing through the MOSFET M2B can be regarded as a sink $I_{sink}$. As for node N3 located at the cross point between the current mirror formed by the MOSFETs M1A and M1B and the current mirror formed by the MOSFETs M2A and M2B, since the sink current $I_{sink}$ is greater than or equal to the pull current $I_{pull}$, the voltage $V_{N3}$ at node N3 will be kept at 0V (i.e., grounded). Accordingly, the voltage $V_{N3}$ at node N3 is lower than the threshold voltage $V_t$ of the MOSFET M4, and thus the MOSFET M4 is operated at the cut-off region.

Therefore, the current I8 to discharge the load capacitor $C_L$ is the sum of current I5 and current I6, and current I8 is equal to 1 μA, which is capable of exactly compensating for the leakage current of the power MOSFET 220. It should be noted that, in the first bleeder-current mode, the dynamic bleeder-current circuit 230 does not raise the power consumption of the voltage source VDD.

When the voltage $V_{out}$ is higher than the reference voltage $V_{ref}$, it indicates that there is voltage overshoot at the output terminal of the voltage regulator 200. Meanwhile, the voltage $V_{N1}$ (i.e., regarded as the bias voltage $V_{bias}$) at node N1 may gradually approach the voltage VPP, such that the MOSFET enters the cut-off region. Accordingly, the current I3 may gradually decrease from 0.25 μA to 0 μA. That is, the voltage $V_{GS}$ of the MOSFET M2A is lowered accordingly, such that the MOSFETs M2A and M2B gradually enter the cut-off region, and the current I4 may gradually decrease from 0.75 μA to 0 μA.

With regard to node N3, since the sink current $I_{sink}$ (i.e., current I4) is 0 μA and the pull current $I_{pull}$ (i.e., current I5) is 0.5 μA, the pull current $I_{pull}$ may charge the coupling capacitor around node N3 and the capacitor formed by the MOSFET M5, such that the voltage $V_{N3}$ at node N3 exceeds the threshold voltage $V_t$. Accordingly, the MOSFET M4 is activated to provide a large bleeder current (e.g., current I7 approximately equal to 1 mA) to discharge the load capacitor $C_L$, and thus the output voltage $V_{out}$ at the output terminal of the voltage regulator 200 may gradually decrease. It should be noted that, in the second bleeder-current mode, since the scale of the currents I5 and I6 (e.g., about 1 μA) is very small (i.e., about 1000 times smaller) compared to current I7 (e.g., about 1 mA), the total bleeder current I8 can be regarded as the current I7.

It should be noted that when the output voltage $V_{out}$ at the output terminal of the voltage regulator 200 gradually decreases to the reference voltage $V_{ref}$, the voltage at node N1 may decrease from the voltage VPP, such that the MOSFET M3 is activated again and the dynamic bleeder-current circuit 230 enters the first bleeder-current mode again to discharge the load capacitor $C_L$ with a fixed bleeder current $I_{fix}$.

Compared with the voltage regulator 100 in FIG. 1, the voltage regulator 200 in FIG. 2B has 7 additional MOSFETs to achieve the function of a dynamic bleeder current. In addition, only one operational amplifier 210 is used in the voltage regulator 200, and the input stage 2301 in the first bleeder-current circuit 2300 is controlled by a bias voltage (e.g., voltage at node N1) in the operational amplifier 210. Accordingly, one offset voltage is required in the operational amplifier 210, and the impact of variations in the manufacturing process can be reduced. In some embodiments, the power MOSFET 220 is not limited to the N-type power MOSFET, and the power MOSFET 220 can be implemented by a P-type power MOSFET.

FIG. 3A is a diagram of an operation curve between the voltage and current of the voltage regulator in accordance with the embodiment of FIG. 1. FIG. 3B is a diagram of an operation curve between the voltage and current of the voltage regulator in accordance with the embodiment of FIG. 2B. FIG. 1, FIG. 2B, and FIGS. 3A-3B are referenced in the following embodiments.

In FIG. 3A, curve 301 indicates the relationship between the output voltage $V_{out}$ of the voltage regulator 100 versus time, and curve 302 indicates the relationship between the bleeder current of the voltage regulator 100 versus time.

In the time interval from time t0 to time t1, the output voltage $V_{out}$ of the voltage regulator 100 is kept at the reference voltage $V_{ref}$. At time t1, there is voltage overshoot at the output voltage $V_{out}$ of the voltage regulator 100, and the output voltage $V_{out}$ is raised to the overshoot voltage VOS in a very short time. Since the MOSFET 130 provides a small fixed bleeder current $I_{fix}$ (e.g., 1 μA), it may take a very long time, such as time interval T1 from time t1 to time t2, to fully discharge the electric charges stored in the load capacitor $C_L$, such that the output voltage $V_{out}$ of the voltage regulator 100 decreases to the reference voltage $V_{ref}$ from the overshoot voltage VOS.

In FIG. 3B, curve 303 indicates the relationship between the output voltage $V_{out}$ of the voltage regulator 200 versus time, and curve 304 indicates the relationship between the bleeder current of the voltage regulator 200 versus time.

In the time interval from time t0 to time t1, the output voltage $V_{out}$ of the voltage regulator 200 is kept at the reference voltage $V_{ref}$, and the dynamic bleeder-current circuit 230 is operated in the first bleeder-current mode, such as using the MOSFET 240 to provide a fixed bleeder current $I_{fix}$ to discharge the load capacitor CL. At time t1, there is voltage overshoot at the output voltage $V_{out}$ of the voltage regulator 200, and the output voltage $V_{out}$ is raised to the overshoot voltage VOS in a very short time. Meanwhile, the dynamic bleeder-current circuit 230 is switched to the second bleeder-current mode. For example, the voltage $V_{N3}$ at node N3 in FIG. 2B is increased to exceed the threshold voltage $V_t$ of the MOSFET M4, such that the MOSFET M4 is activated to provide a large bleeder current (e.g., current I7) to discharge the load capacitor $C_L$. Since the scale of the current I7 is far greater than the fixed bleeder current $I_{fix}$ (e.g., 1000 times larger), the output voltage $V_{out}$ of the voltage regulator 200 can be approximately discharged to the reference voltage $V_{ref}$ in the time interval T2 from time t1 to time t3. Referring to FIG. 3A and FIG. 3B, it can be understood that the time interval T2 is shorter than the time interval T1.

When the output voltage $V_{out}$ at the output terminal of the voltage regulator 200 is decreased to approximately the reference voltage $V_{ref}$, the voltage at node N1 will decrease from the voltage VPP. Then, the MOSFET M3 is activated again, and the dynamic bleeder-current circuit 230 may enter the first bleeder-current mode again to discharge the load capacitor $C_L$ with the fixed bleeder current.

Figure 4:
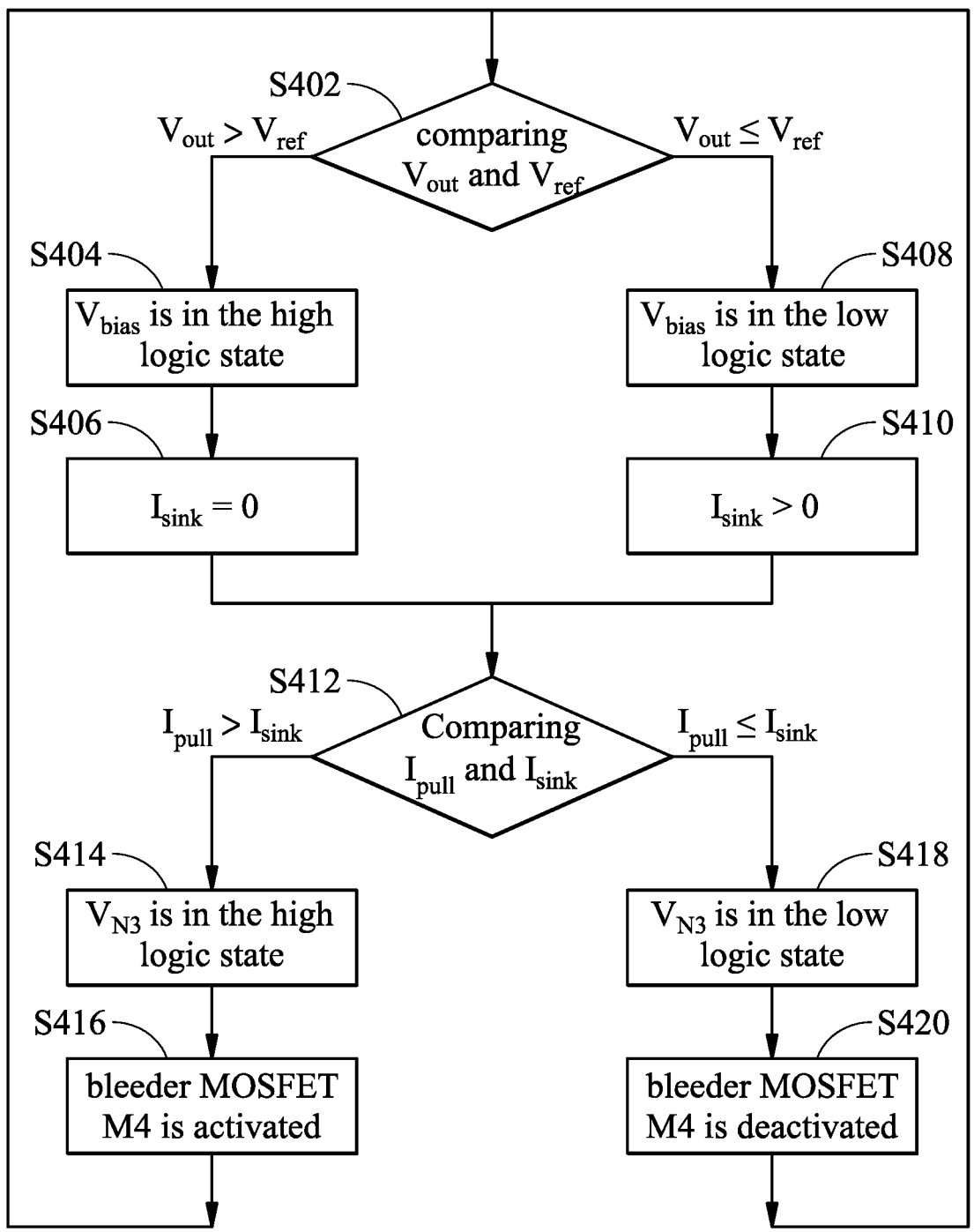
FIG. 4 is a diagram of the operation flow of the voltage regulator 200 in accordance with an embodiment of the invention.

FIG. 4 is a diagram of the operation flow of the voltage regulator 200 in accordance with an embodiment of the invention.

Referring to both FIG. 2B and FIG. 4, in step S402, the voltage $V_{out}$ and the voltage $V_{ref}$ are compared by the operational amplifier 210. For example, the voltage $V_{ref}$ is the reference voltage electrically connected to the positive input terminal of the operational amplifier 210. The voltage $V_{out}$ is the output voltage of the voltage regulator 200, that is connected to the negative input terminal of the operational amplifier 210. When the voltage $V_{out}$ is higher than the voltage $V_{ref}$, step S404 is performed. When the voltage $V_{out}$ is lower than or equal to the voltage $V_{ref}$, step S408 is performed.

In step S404, the bias voltage $V_{bias}$ is in the high logic state. For example, when the voltage $V_{out}$ is higher than the voltage $V_{ref}$, it indicates that there is voltage overshoot at the output terminal of the voltage regulator 200, and the voltage at node N1 (i.e., bias point) may be close to the voltage VPP. Thus, the bias voltage $V_{bias}$ at node N1 is in the high logic state.

In step S406, the sink current $I_{sink}$ is equal to 0. For example, when the bias voltage $V_{bias}$ at node N1 is in the high logic state, the MOSFET M3 is operated in the cut-off region, and thus the current I3 is equal to 0. Accordingly, the MOSFETs M2A and M2B are operated in the cut-off region, and the sink current $I_{sink}$ (i.e., current I4) flowing through the MOSFET M2B is equal to 0.

In step S408, the bias voltage $V_{bias}$ is in the low logic state. For example, when the voltage $V_{out}$ is equal to the reference voltage $V_{ref}$, the currents I1 and I2 are equal to half the bias current $I_{bias}$, and the bias voltage at node N1 is in the low logic state.

In step S410, the sink current $I_{sink}$ is greater than 0. For example, when the bias voltage $V_{bias}$ at node N1 is in the low logic state, the MOSFET M3 is activated. In addition, the W/L ratio of the MOSFET M3 is a predetermined ratio (e.g., 1/2) of the W/L ratio of the MOSFETs M7A and M7B. Since the MOSFETs M3, M7A, and M7B form a current mirror, the current I3 flowing through the MOSFET M3 is half the current I2 flowing through the MOSFETs M7B and M6B. Accordingly, the MOSFET M3 may map the current I2 flowing through the bias point (e.g., node N1) with the predetermined ratio (e.g., 1/2) to generate the mapped current I3. If the currents I1 and I2 are equal to 0.5 μA at this time, the current I3 flowing through the MOSFET M3 is equal to 0.25 μA. The current I3 also flows through the MOSFET M2A. However, since the W/L ratio of the MOSFET M2B is 3 times the W/L ratio of the MOSFET M2A, the current I4 (i.e., the sink current $I_{sink}$) is equal to 0.75 μA.

In step S412, the pull current $I_{pull}$ and the sink current $I_{sink}$ are compared. The pull current $I_{pull}$ may be the current I5 flowing through the MOSFET M1A, and the current I5 can be obtained by mapping the current I6 (e.g., about 0.5 μA) flowing through the MOSFET M1B via the current mirror. When the pull current $I_{pull}$ is greater than the sink current $I_{sink}$, step S414 is performed. When the pull current $I_{pull}$ is smaller than or equal to the sink current $I_{sink}$, step S418 is performed.

In step S414, the bleeder-current control voltage VN3 is in the high logic state. For example, when the pull current $I_{pull}$ is greater than the sink current $I_{sink}$, it indicates there is a net current flowing into node N3 to charge the coupling capacitor around node N3 and the capacitor formed by the MOSFET M5, such that the bleeder-current control voltage $V_{N3}$ is in the high logic state.

In step S416, the bleeder MOSFET M4 is activated. Since the bleeder-current control voltage $V_{N3}$ is in the high logic state, the bleeder MOSFET M4 is activated to provide a large current (e.g., 1 mA) to discharge the electric charges stored in the load capacitor CL.

In step S418, the bleeder-current control $V_{N3}$ is in the low logic state. When the pull current $I_{pull}$ is smaller than or equal to the sink current $I_{sink}$, it indicates that the bleeder-current control voltage $V_{N3}$ at node N3 is regarded as being grounded, and thus the bleeder-current control voltage $V_{N3}$ is in the low logic state.

In step S420, the bleeder MOSFET M4 is deactivated. Since the bleeder-current control voltage $V_{N3}$ is in the low logic state, the bleeder MOSFET M4 is deactivated. Meanwhile, the dynamic bleeder-current circuit 230 may provide the fixed bleeder current $I_{fix}$ (e.g., equal to the current I6), and the total bleeder current I8 of the load capacitor $C_L$ is equal to the sum of current I5 and current I6.

It should be noted that operations of the voltage regulator 200 may follow the flow in FIG. 4 to determine whether there is voltage overshoot at the output voltage $V_{out}$ of the voltage regulator 200. If there is voltage overshoot at the output voltage $V_{out}$ of the voltage regulator 200, the dynamic bleeder-current circuit 230 can be switched to the second bleeder-current mode to provide a large bleeder current (i.e., the bleeder MOSFET M4 is activated).

In view of the above, a voltage regulator and a dynamic bleeder-current circuit are provided in the invention. The voltage regulator and the dynamic bleeder-current circuit are capable of determining whether there is voltage overshoot at the output voltage at the output terminal of the voltage regulator (e.g., the output voltage of the voltage regulator is higher than the reference voltage). In addition, the voltage regulator and the dynamic bleeder-current circuit are also capable of providing a large bleeder current when it is determined that there is voltage overshoot for the output voltage at the output terminal of the voltage regulator.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic bleeder-current circuit for use in a voltage regulator, the dynamic bleeder-current circuit comprising:
    a first bleeder-current circuit, comprising:
        an input stage, configured to map a bias current in an operational amplifier in the voltage regulator with a predetermined ratio to generate a mapped current;
        a current comparator, configured to compare a pull current and a sink current, wherein the sink current is generated by the mapped current; and
        a bleeder-current output stage, configured to determine whether to use a first current to discharge a load capacitor of the voltage regulator according to a comparison result from the current comparator; and
    a second bleeder-current circuit, configured to provide a second bleeder current to discharge the load capacitor of the voltage regulator, wherein the first current is greater than the second current, and the pull current is equal to the second current.

2. The dynamic bleeder-current circuit as claimed in claim 1, wherein the input stage comprises a first P-type MOSFET, and a gate, source, and drain of the first P-type MOSFET are respectively electrically connected to a bias point in the operational amplifier through which the bias current flows, a voltage source, and a first node, wherein the predetermined ratio is 0.5.

3. The dynamic bleeder-current circuit as claimed in claim 2, wherein the current comparator comprises a first current mirror and a second current mirror, and the first current mirror maps the mapped current with a predetermined multiple to generate the sink current at a second node, and the second current mirror maps the second current to generate the pull current at the second node.

4. The dynamic bleeder-current circuit as claimed in claim 3, wherein the first current mirror comprises a first N-type MOSFET and a second N-type MOSFET, wherein a gate, drain, and source of the first N-type MOSFET are respectively electrically connected to the first node, the first node, and a grounded voltage source, and a gain, drain, and source of the second N-type MOSFET are respectively electrically connected to the first node, the second node, and the grounded voltage source,
    wherein the second N-type MOSFET has a first width-to-length ratio, the first N-type MOSFET has a second width-to-length ratio, and the first width-to-length ratio is 3 times greater than the second width-to-length ratio.

5. The dynamic bleeder-current circuit as claimed in claim 3, wherein the second current mirror comprises a second P-type MOSFET and a third P-type MOSFET, and a gain, drain, and source of the second P-type MOSFET are respectively electrically connected to a third node, the second node, and an output terminal of the voltage regulator, and a gate and a drain of the third P-type MOSFET are electrically connected to the third node, and a source of the third P-type MOSFET is electrically connected to the output terminal of the voltage regulator.

6. The dynamic bleeder-current circuit as claimed in claim 5, wherein the bleeder-current output stage comprises a third N-type MOSFET, and a gate, drain, and source of the third N-type MOSFET are respectively electrically connected to the second node, the output terminal of the voltage regulator, and the grounded voltage source.

7. The dynamic bleeder-current circuit as claimed in claim 6, wherein the bleeder-current output stage further comprises a fourth N-type MOSFET, and a gate of the fourth N-type MOSFET is electrically connected to the second node, and drain, and a source of the fourth N-type MOSFET are electrically connected to the grounded voltage source.

8. The dynamic bleeder-current circuit as claimed in claim 6, wherein the second bleeder-current circuit comprises a fifth N-type MOSFET, and a gate, drain, and source of the fifth N-type MOSFET are respectively electrically connected to a control voltage source, the third node, and the grounded voltage source,
    wherein when the pull current is greater than the sink current, a bleeder-current control voltage at the second node is in a high logic state to activate the third N-type MOSFET to provide the first current to discharge the load capacitor of the voltage regulator,
    wherein when the pull current is smaller than or equal to the sink current, the bleeder-current control voltage at the second node is in a low logic state to deactivate the third N-type MOSFET.

9. The dynamic bleeder-current circuit as claimed in claim 1, wherein the voltage regulator further comprises an N-type power MOSFET, and a sum value of the second current flowing through the N-type power MOSFET and the pull current is equal to a leakage current of the N-type power MOSFET.

10. A voltage regulator, comprising:
    an operational amplifier having a positive input terminal, a negative input terminal, and an output terminal that are respectively electrically connected to a reference voltage of the voltage regulator, an output terminal of the voltage regulator, and a first node, wherein the output terminal of the voltage regulator has a load capacitor;

an N-type power MOSFET having a gate, drain, and source respectively electrically connected to the first node, a voltage source, and the output terminal of the voltage regulator; and a dynamic bleeder-current circuit, comprising:
  a first bleeder-current circuit, comprising:
    an input stage, configured to map a bias current in an operational amplifier in the voltage regulator with a predetermined ratio to generate a mapped current;
    a current comparator, configured to compare a pull current and a sink current, wherein the sink current is generated by the mapped current; and
    a bleeder-current output stage, configured to determine whether to use a first current to discharge a load capacitor of the voltage regulator according to a comparison result from the current comparator; and
  a second bleeder-current circuit, configured to provide a second bleeder current to discharge the load capacitor of the voltage regulator, wherein the first current is greater than the second current, and the pull current is equal to the second current.

* * * * *